(12) United States Patent
Nakahara et al.

(10) Patent No.: US 9,340,900 B2
(45) Date of Patent: May 17, 2016

(54) EPITAXIAL WAFER AND METHOD OF PRODUCING SAME

(75) Inventors: Shinji Nakahara, Tokyo (JP); Masato Sakai, Tokyo (JP); Takayuki Dohi, Tokyo (JP)

(73) Assignee: Sumco Corporation (JP)

(*) Notice: Subject to any disclaimer, the term of this patent is extended or adjusted under 35 U.S.C. 154(b) by 1517 days.

(21) Appl. No.: 11/850,599

(22) Filed: Sep. 5, 2007

(65) Prior Publication Data

US 2008/0057324 A1    Mar. 6, 2008

(30) Foreign Application Priority Data

Sep. 6, 2006 (JP) .................................. 2006-240962
Sep. 4, 2007 (JP) .................................. 2007-228716

(51) Int. Cl.

| H01L 21/304 | (2006.01) |
|---|---|
| C30B 25/20 | (2006.01) |
| C30B 25/02 | (2006.01) |
| C30B 23/02 | (2006.01) |
| C30B 33/00 | (2006.01) |
| H01L 21/02 | (2006.01) |
| H01L 21/768 | (2006.01) |
| C30B 29/06 | (2006.01) |

(52) U.S. Cl.
CPC ................ C30B 25/20 (2013.01); C30B 23/02 (2013.01); C30B 25/02 (2013.01); C30B 29/06 (2013.01); C30B 33/005 (2013.01); H01L 21/02024 (2013.01); H01L 21/76814 (2013.01)

(58) Field of Classification Search
CPC ........ C30B 25/02; C30B 23/02; C30B 33/00; C30B 33/005; H01L 21/02024; H01L 21/76814

USPC .............. 117/84, 88; 438/787, 758, 778, 906, 438/959
See application file for complete search history.

(56) References Cited

U.S. PATENT DOCUMENTS

| 6,323,140 | B1 * | 11/2001 | Mayusumi et al. ........... 438/787 |
| 6,376,335 | B1 * | 4/2002 | Zhang et al. .................. 438/471 |
| 6,482,749 | B1 * | 11/2002 | Billington et al. ............ 438/745 |
| 2001/0014544 | A1 * | 8/2001 | Tanaka et al. ................. 438/905 |

(Continued)

FOREIGN PATENT DOCUMENTS

| EP | 451855 A1 * | 10/1991 | ........... H01L 21/302 |
| EP | 1788620 A | 5/2007 | |

(Continued)

OTHER PUBLICATIONS

Patent Abstracts of Japam, English computer translation of JP 11-1450888 (2014).*

(Continued)

*Primary Examiner* — Matthew Song
(74) *Attorney, Agent, or Firm* — Kolisch Hartwell, P.C.

(57) ABSTRACT

A method of producing an epitaxial wafer, comprising: performing epitaxial growth of silicon on a main surface of a wafer made of a silicon single crystal; performing surface flattening pretreatment of a main surface of the wafer using a treatment liquid of a predetermined composition at a temperature of 100° C. or less, thereby forming an oxide film of a predetermined thickness while removing particles adhered on the main surface of the wafer; and performing a surface polishing step where the main surface of the wafer is mirror polished.

10 Claims, 7 Drawing Sheets

(56) References Cited

U.S. PATENT DOCUMENTS

| | | | |
|---|---|---|---|
| 2002/0127766 A1* | 9/2002 | Ries et al. .................... | 438/94 |
| 2003/0045089 A1* | 3/2003 | Wenski et al. ............... | 438/626 |
| 2003/0104222 A1* | 6/2003 | Ono et al. .................... | 428/446 |
| 2005/0139231 A1* | 6/2005 | Abadie et al. ................ | 134/2 |
| 2006/0201413 A1* | 9/2006 | Nishizawa .................... | 117/84 |

FOREIGN PATENT DOCUMENTS

| | | | |
|---|---|---|---|
| EP | 1898450 A2 | | 3/2008 |
| JP | H8-17163 | | 2/1996 |
| JP | 11145088 A | * | 5/1999 |
| JP | 11-283924 | | 10/1999 |
| JP | 11-329982 | | 11/1999 |
| JP | 2000-031071 | | 1/2000 |
| JP | 2001253797 A | | 9/2001 |
| JP | 2003-059933 | | 2/2003 |
| JP | 2006-100596 | | 4/2006 |
| TW | 200625413 | | 7/2006 |
| WO | 2006028017 A | | 3/2006 |

OTHER PUBLICATIONS

European Search Report from corresponding European Application No. EP07017349 dated Nov. 28, 2007.

Japanese Patent Office, Notice of Reasons for Rejection dated Dec. 6, 2011, issued in connection with related Japanese Application No. 2007-228716, 6 pages.

Office Action dated May 5, 2011 in connection with corresponding Taiwanese Patent Application No. 096133147.

European Patent Office, "Communication Pursuant to Article 94(3) EPC" in connection with related European Patent Application No. EP 07017349.7 dated May 20, 2014, 5 pages.

* cited by examiner

FIG. 7A  CONVENTIONAL EXAMPLE
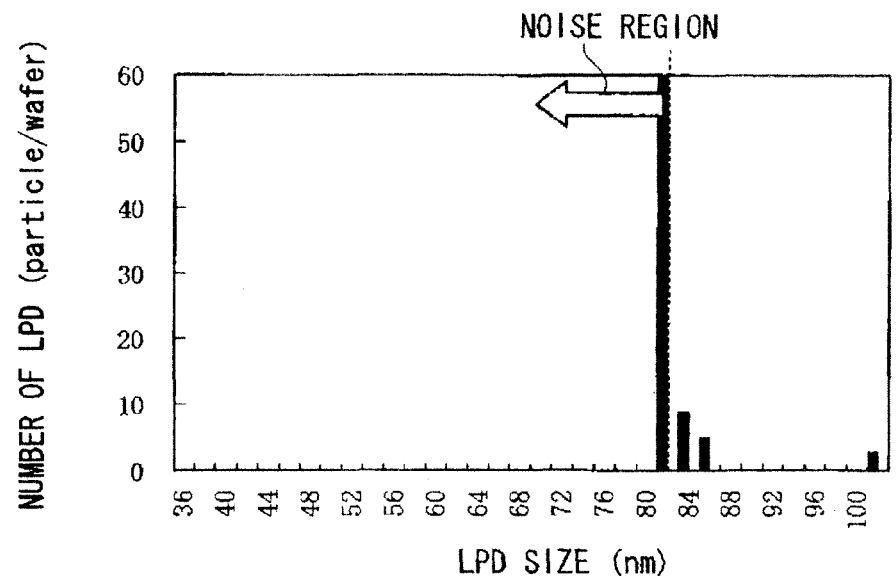
FIG. 7B  EXAMPLE
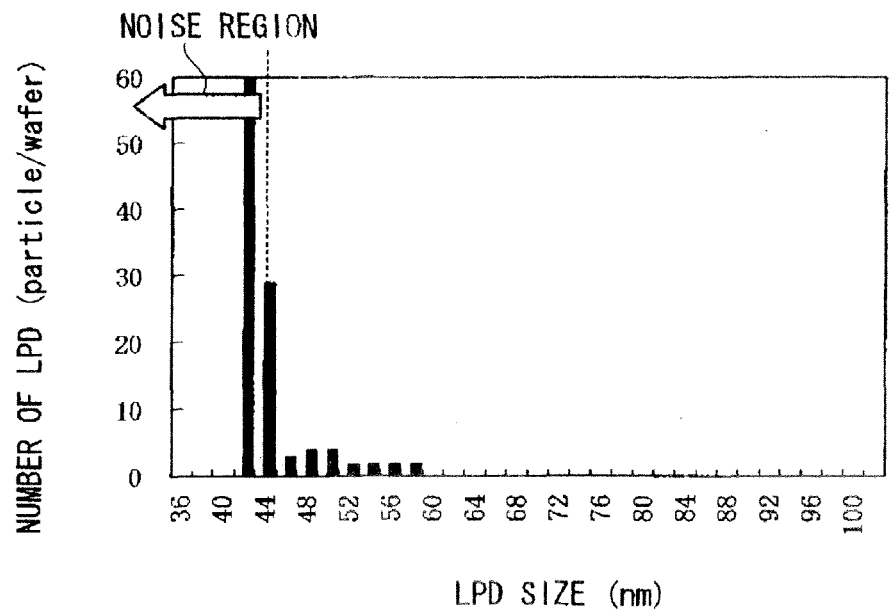

EPITAXIAL WAFER AND METHOD OF PRODUCING SAME

BACKGROUND OF THE INVENTION

1. Field of the Invention

The present invention relates to an epitaxial wafer and a method of producing the same. Priority is claimed on Japanese Patent Application No. 2006-240962, filed Sep. 6, 2006, and Japanese Patent Application No. 2007-228716, filed on Sep. 4, 2007, the content of which is incorporated herein by reference.

2. Description of Related Art

There is a trend to miniaturize substrates of semiconductor devices produced using silicon wafers, for example, so as to reduce the production cost of semiconductor devices. In accordance with this trend, there is an increasing demand for improving surface roughness and surface flatness of semiconductor wafers. In addition, with regard to light point defects (LPDs) on a semiconductor wafer, reduction of size and numbers of the LPDs are further required.

In many cases, conventionally used silicon substrates are produced using epitaxial wafers obtained from (100) crystal (hereafter, (100) crystal denotes a crystal for obtaining {100} wafers: wafers having a main surface constituted of (100) plane). Recently, substrates produced using epitaxial wafers obtained from (110) crystal (hereafter, (110) crystal denotes a crystal for obtaining {110} wafers: wafers having a main surfaces constituted of (110) plane) are recognized as substrates of next generation which are appropriately applicable for MOS structure devices such as MOSFETs (Metal Oxide Semiconductor Field Effect Transistors), MPUs (Micro-Processing Units), and Logic Arrays (e.g., Patent Reference 1: Japanese Unexamined Patent Application, First Publication No. 2001-253797). Especially for double face polished {100} substrates having a diameter of not less than 8 inches, reduction of the production costs in consistent with improvement of device property is considered.

An epitaxial wafer made of a (100) crystal has an excellent flatness (surface roughness) which may be reflected on detection limit (minimum size to be detected) of LPD size (size of light point defect) of 100 nm or less. On the other hand, an epitaxial wafer made of a (110) crystal has a large surface roughness compared to the epitaxial wafer made of a (100) crystal. Therefore, the detection limit of the LPD size is increased and small sized LPDs cannot be detected. Where numerous LPDs exist on the main surface of the wafer, the LPDs cause a problem of failure leak current in a device production process. It is considered that inferior surface roughness and larger detection limit of LPDs of the epitaxial wafer made of a (110) crystal compared to the epitaxial wafer made of an (100) crystal are caused by difference of physical properties such as atomic arrangement.

As a method for improving the surface roughness of a wafer to a level nearly the same as the substrate, there is a known method, for example as described in Patent Reference 2 (Japanese Examined Patent Application, Second Publication H8-17163), where after epitaxial growth of an epitaxial layer on a wafer, the main surface of the wafer is mirror polished so as to remove defects such as crowns generated by the epitaxial growth, thereby preventing the generation of dusts.

The above-described method is not sufficient for a case where an LPD size of 100 nm or less is required for a product quality. In the above-described method, there is a possibility that a state of LPDs after the polishing and qualities of surface roughness and surface flatness are changed depending on the surface state after the epitaxial growth. Especially, in the case of a (110) wafer, because of its large surface roughness after the epitaxial growth compared to the (100) wafer, surface roughness and flatness cannot be improved sufficiently by mirror polishing after the growth of the epitaxial layer.

When LPDs existing on the main surface of a wafer are measured using a laser light, degree of flatness has a large influence on the detection noise in the measurement of LPDs. Specifically, detection noise in the time of detecting LPDs increases with decreasing quality of surface roughness. Therefore, in the currently used conventional epitaxial wafer made of an (110) crystal, because of inferior surface roughness of the wafer, LPDs smaller than 100 nm in size cannot be detected by the measurement. In such surface conditions, it is difficult to correctly detect LPDs existing on the main surface of next generation type epitaxial wafers made of (110) crystal to which an LPD size of 100 mm or less is required.

Where the polishing after the epitaxial growth is performed to achieve large removal amount, it is not preferable since unevenness in the thickness is increased and flatness of the wafer is deteriorated. On the other band, where the polishing after the epitaxial growth is performed to achieve a small removal amount, the wafer has a large surface roughness, the detection limit of LPD size is larger than 100 nm, and small sized LPDs cannot be detected.

An object of the present invention is to provide, as an intermediate treatment between the epitaxial growth and surface polishing, low-temperature oxide film formation treatment of a main surface of a wafer using a treatment liquid (chemicals, chemical liquid) of a predetermined composition, thereby providing a method of producing an epitaxial wafer, which enables refining of detection limit of LPD size. Another object of the present invention is to provide an epitaxial wafer produced by the above-described method.

SUMMARY OF THE INVENTION

A first aspect of the present invention is a method of producing an epitaxial wafer, comprising:

performing epitaxial growth of silicon on a main surface of a wafer made of a silicon single crystal (single crystalline silicon wafer);

performing surface flattening pretreatment of the main surface of the wafer using a treatment liquid (chemicals) of a predetermined composition at a temperature of 100° C. or less, thereby forming an oxide film of a predetermined thickness while removing particles adhered on the main surface of the wafer; and performing a surface polishing step where the main surface of the wafer is mirror polished.

A second aspect of the present invention is a method of producing a silicon wafer according to the above-described first aspect, wherein the predetermined thickness of the oxide film is in a range from 5 to 30 Å (0.5 to 3.0 nm).

A third aspect of the present invention is a method of producing an epitaxial wafer according to the above-described first aspect, wherein the treatment liquid of a predetermined composition is a liquid which contains an oxidizing agent.

A fourth aspect of the present invention is a method of producing an epitaxial wafer according to the above-described third aspect, wherein the oxidizing agent is ozone and/or aqueous solution of hydrogen peroxide.

A fifth aspect of the present invention is a method of producing an epitaxial wafer according to any one of the above-described first to fourth aspects, further comprising, before the surface flattening pretreatment, performing removal of a natural oxide film (spontaneous oxide film) of the wafer.

A sixth aspect of the present invention is a method of producing an epitaxial wafer according to any one of the above-described first to fifth aspects, wherein the wafer made of a silicon single crystal is a double face polished {110} wafer ({110} wafer which has been subjected to polishing a front surface and a back surface opposite to the front surface).

A seventh aspect of the present invention is a method of producing an epitaxial wafer according to any one of the above-described first to sixth aspects, wherein only the main surface or both the main surface and a back surface of the wafer is mirror polished in the surface polishing step.

An eighth aspect of the present invention is a method of producing an epitaxial wafer according to the above-described first to seventh aspects, further comprising, an edge polishing step to mirror polish a surface of edge portion of the wafer before the surface polishing step.

A ninth aspect of the present invention is a method of producing an epitaxial wafer according to the above-described eighth aspect, wherein the surface flattening pretreatment is performed at least at one stage (one or both stage) selected from a stage between the epitaxial growth and the edge polishing and a stage between the edge polishing step and the surface polishing step.

A tenth aspect of the present invention is an epitaxial wafer produced by the production method in accordance with any one of the above-described first to ninth aspects, wherein a minimum detected size (detective limit size) of LPD (Light Point Defect) detected on the main surface of the epitaxial wafer is 100 nm or less.

An eleventh aspect of the present invention is an epitaxial wafer produced by the production method in accordance with any one of the above-described first to ninth aspects, wherein a detected size of LPD (size of LPD to be detected) existing on a main surface of the epitaxial wafer is 100 nm or less.

In the method of producing an epitaxial wafer according to the present invention, between the epitaxial growth of an epitaxial layer and surface polishing of a main surface of the wafer, wafer flattening pretreatment is further performed. In the wafer flattening pretreatment, a main surface of a wafer is treated using a treatment liquid of a predetermined composition under a low temperature of 100° C. or less, thereby forming an oxide film having a predetermined thickness on the main surface of the wafer while removing particles adhered to the main surface of the wafer. By this constitution, it is possible to provide a method of producing an epitaxial wafer, where the detection limit size of LPDs is reduced.

In an epitaxial wafer produced by the method of the present invention, sizes of LPDs which exist on the main surface of the epitaxial wafer and are detected by measurement are 100 nm or less even where the epitaxial wafer is made of a (110) crystal. Therefore, where LPDs existing on the main surface of the epitaxial wafer are measured by a measurement using an apparatus for inspecting surface conditions of a wafer utilizing laser light, sizes and numbers of the LPDs can be measured sufficiently correctly.

BRIEF DESCRIPTION OF THE DRAWINGS

FIG. 7A and FIG. 7B are graphs showing results of the measurement of sizes and number of LPD on (110) wafers. FIG. 7A is a case of conventional example (Comparative Example) in which wafer flattening pretreatment was not performed. FIG. 7B is a case of Example in which wafer flattening pretreatment was performed.

DETAILED DESCRIPTION OF THE INVENTION

Next, a method of producing an epitaxial wafer in accordance with the present invention is explained with reference to drawings.

Figure 1:
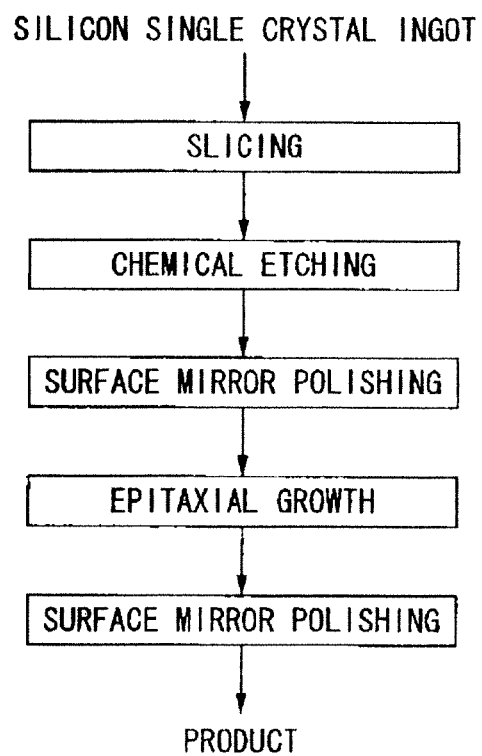
FIG. 1 is a flow chart for explaining a production process of an epitaxial wafer in accordance with the conventional production method.

In the conventional production method of an epitaxial wafer, as exemplified in FIG. 1, after slicing a wafer from a silicon single crystal ingot, a main surface of the sliced wafer is chemically etched, and subsequently mirror polished by chemical polishing. Next, on the wafer heated at, for example 1150° C. in a hydrogen atmosphere, a mixture of carrier gas and silicon compound such as silicon tetrachloride, monosilane ($SiH_4$), trichlorosilane ($SiHCl_3$), and dichlorosilane ($SiH_2Cl_2$) is introduced. Using silicon atoms provided by decomposition of the silicon compound, a silicon layer having a thickness of, for example, 2 to 30 μm is epitaxially grown on the surface of the silicon wafer. After that, the main surface of the wafer having the single crystalline silicon layer is subjected to surface mirror polishing by a chemical polishing. Thus an epitaxial wafer is produced.

However, in the conventional method as described-above, it is impossible to obtain a satisfactory product since the quality of the LPDs and flatness of the wafer is changed depending on the surface state of the wafer after the epitaxial growth.

As a result of extensive effort intended to reduce detected size of LPDs, the inventors invented the present invention based on the following findings.

Between the epitaxial growth step and surface polishing step, the main surface of a wafer is pretreated in a treatment liquid having a predetermined composition at a temperature of 100° C. or less. Preferably, the treatment liquid may be a liquid which contains oxidizing agent such as ozone and/or hydrogen peroxide. By this treatment which is here referred to as wafer flattening pretreatment, while removing particles adhered to the main surface of the wafer, an oxide film having a predetermined thickness is formed on the main surface. After that, the wafer is further subjected to surface polishing. By the above-described process, it is possible to remarkably improve surface roughness of the wafer and reduce detected size of LPDs on the main surface of the wafer, and reduce numbers of LPDs adhered to the wafer.

That is, a method of producing an epitaxial wafer according to the invention comprises an epitaxial growth step where silicon is epitaxially grown on the main surface of the silicon wafer, and polishing step where the main surface of the silicon wafer is mirror polished. The method further comprises a wafer flattening pretreatment step between the epitaxial growth step and the polishing step. In the wafer flattening pretreatment step, the main surface of the wafer is treated in a treatment liquid of a predetermined composition at a temperature of 100° C. or less, thereby forming an oxide film on the main surface of the wafer while removing particles adhered to the main surface of the wafer.

The reason for controlling the treatment temperature at 100° C. or less in the wafer flattening pretreatment step can be explained as follows. The treatment at a temperature higher than 100° C. does not largely improve the effect for removing particles which have adhered to the main surface of the wafer before the treatment. Therefore, it is not preferable to perform the oxidation treatment at a high temperature. Therefore, in the wafer flattening pretreatment step, the treatment temperature was controlled to be 100° C. or less.

Figure 2:
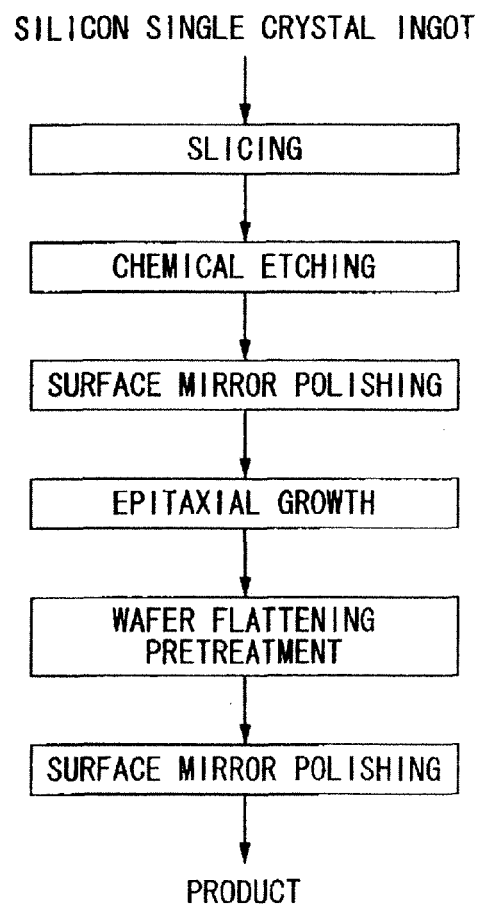
FIG. 2 is a flow chart for explaining a production process of an epitaxial wafer in accordance with an embodiment of a production method of the present invention.

FIG. 2 is a flow chart for explaining a production process of an epitaxial wafer in accordance with the production method of the present invention.

In the method of producing an epitaxial wafer shown in FIG. 2, after forming a wafer of a predetermined thickness by slicing the wafer from a single crystalline silicon ingot, the main surface of the sliced wafer is chemically etched. After the etching, the wafer is subjected to surface mirror polishing by a chemical polishing. Next, while heating the wafer at a temperature of 1000 to 1180° C., for example 1100° C., mixture of silicon compound and a carrier gas is introduced to the main surface of the wafer. By this step, using silicon atoms decomposed from the silicon compound, a single crystalline silicon layer is epitaxially grown on the surface of the silicon wafer. For example, a single crystalline silicon layer having a thickness of not smaller than 1 μm and smaller than 5 μm is formed on the surface of the wafer. The above-described silicon compound may be selected from silicon compounds such as silicon tetrachloride, monosilane ($SiH_4$), tichlorosilane ($SiHCl_3$), and dichlorosilane ($SiH_2Cl_2$).

Next, the wafer is subjected to wafer flattening pretreatment thereby forming an oxide film having a predetermined thickness. After that, the wafer is further subjected to a surface mirror polishing step by chemical polishing. Thus, an epitaxial wafer is produced.

Figure 3:
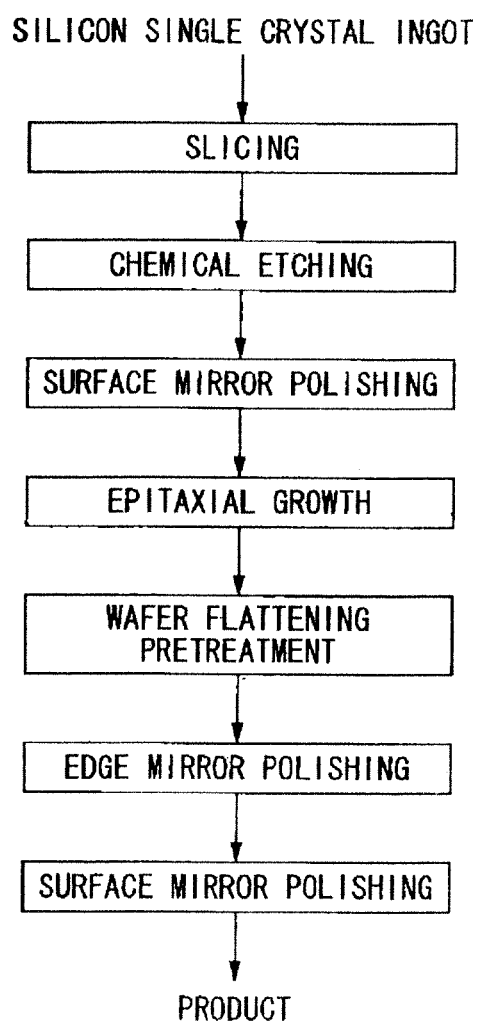
FIG. 3 is a flow chart showing another embodiment of the present invention.

FIG. 3 shows an another embodiment (second embodiment) according to the present invention. A method of producing a silicon wafer according to this embodiment further comprises an edge polishing step before the surface mirror polishing step. In the edge polishing step, an edge portion of the wafer is mirror polished. This embodiment is particularly effective where a correction of irregularity of peripheral thickness of the epitaxial wafer is required in terms of high precision (e.g., precision in flatness).

Figure 4:
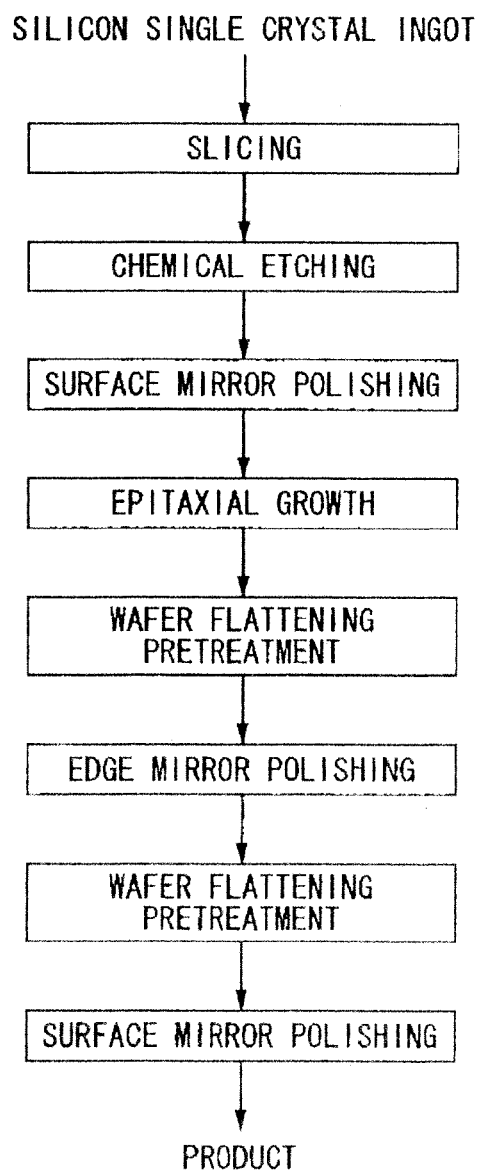
FIG. 4 is a flow chart showing another embodiment of the present invention.

FIG. 4 shows an another embodiment (third embodiment) according to the present invention. In this embodiment, the wafer flattening pretreatment step is performed in a stage between the epitaxial growth step and the edge polishing step, and also in a stage between the edge polishing step and the surface mirror polishing step. This embodiment is effective where further improvement of a surface roughness of the wafer is required.

Figure 5:
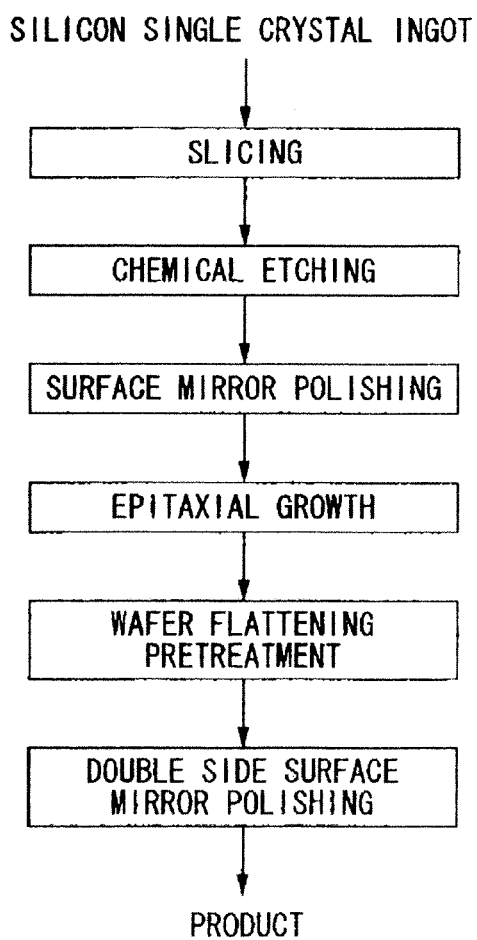
FIG. 5 is a flow chart showing another embodiment of the present invention.

FIG. 5 shows an another embodiment (fourth embodiment) according to the present invention. In this embodiment, in the surface polishing step performed after the epitaxial growth, a front surface (main surface, first surface) and a back surface (second surface) opposite to the front surface are both subjected to mirror polishing. This embodiment is particularly effective where influence of a process gas (e.g., silicon compound gas) reaching the back surface must be corrected in terms of precision.

In accordance with the methods illustrated in FIGS. 2 to 5, where necessary, cleaning of the wafer may be performed at intermediate stages between each step. In the surface polishing step performed after the epitaxial growth step, the extent of removal amount (an amount removed by the polishing) is different depending on the method of surface polishing, e.g., a case of polishing the main surface, a case of polishing both surfaces (main surface and back surface), and a case of polishing both surfaces and further polishing the main surface. In any case of the surface polishing method, it is preferable to control the removal amount of the surface polishing to be in a range from 0.1 to 1.0 μm. Where the removal amount is less than 0.1 μm, it is difficult to completely remove the oxide film formed in the wafer flattening pretreatment. Where the removal amount in the polishing step exceeds 1.0 μm, because of too much removal amount, it is impossible to obtain sufficient flatness, and productivity is decreased.

It is preferable that the predetermined thickness of the above-described oxide film is in a range from 5 to 30 Å (0.5 to 3.0 nm). Where the predetermined thickness of the oxide film is thinner than 5 Å, it is likely to occur scratch caused by particles while polishing the wafer. If the time for polishing is shortened, the effect for improving the surface flatness by forming the oxide film is not obtained sufficiently. Where the predetermined thickness of the oxide film is thicker than 30 Å, a long time is required for the polishing treatment because of a slower polishing rate of the oxide film than that of silicon. Because of unevenness (variation) in polishing rate in the wafer plane and unevenness in thickness of the oxide film, fatness of the wafer is degraded. In addition, it is required a long time for polishing. Therefore, a predetermined thickness of the oxide film exceeding 30 Å is not preferable.

It is preferable that the treatment liquid having a predetermined composition is a liquid which contains an oxidizing agent such as ozone and/or hydrogen peroxide.

The thickness of the above-described oxide film may be controlled by component concentration of cleaning treatment liquid, time and temperature conditions of cleaning. For example, where ozone is contained as the oxidizing agent, it is preferable to treat the wafer in a treatment liquid containing 5 ppm to 40 ppm of ozone in ultrapure water at a temperature of 10 to 30° C. for 10 seconds to 20 minutes.

Since the polishing rate of the oxide film is slower than that of silicon and requires a long time for the polishing treatment, it is preferable that the method of producing a semiconductor wafer of the present invention further comprises a step of removing a natural (spontaneous) oxide film using a solution containing hydrofluoric acid before the wafer flattening pretreatment step.

Where an epitaxial wafer is produced using the method of the present invention, effect of reducing the detected size of LPD can be recognized in cases of {100} wafer and {111} wafer. Especially, in the case of {110} wafer, the effect of reducing the detected size of LPD is particularly effective.

In the epitaxial wafer produced by the above-described production method of the present invention, in the measurement of LPDs using an LPD measuring device utilizing a laser light having a wave length of 300 to 400 nm, it is possible to control the LPD size detected from the main surface of the wafer to be 100 nm or less. It is preferable to control the size of LPD existing on the main surface of the wafer to 65 nm or less.

The epitaxial wafer produced in accordance with the method of the present invention has excellent flatness. Therefore, in the measurement using a LPD measuring device utilizing a laser light having a wave length of 300 to 400 nm, it is possible to control the minimum size of the detected LPD (detection limit size) to be 100 nm or less. It is preferable to control the minimum size of the detected LPD to be 50 nm or less.

Since the detected LPD size can be controlled to be 100 nm or less, preferably to be 65 nm or less in the epitaxial wafer made of (110) crystal produced in accordance with the production method of the present invention, the wafer has excellent surface roughness. Therefore, when measurements of LPDs on the main surface of the wafer is performed using a laser light, it is possible to correctly detect LPDs on the main surface of the wafer. It is more preferable to apply the production method of the present invention to the substrate made of (110) crystal and having an orientation slightly inclined from <110> axis.

EXAMPLE

In the example, (110) wafers having a thickness of 900 μm were obtained by slicing a silicon single crystal having a diameter of 305 mm. The main surfaces of the sliced wafers were chemically etched using an alkaline solution. After that, a front surface and a back surface of each wafer were subjected to mirror polishing by chemical polishing using colloidal silica. Next, while beating the wafer in a hydrogen atmosphere at a temperature of 1130° C., 5 volumetric % of trichlorosilane ($SiHCl_3$) was introduced to the main surfaces of the wafers. By this step, using silicon atoms as decomposition products, an epitaxial silicon layer having a thickness of 3 μm was epitaxially grown on the main surface of each wafer.

Next, by performing wafer flattening pretreatment in which the wafer was dipped for 1 to 10 minutes in aqueous solution containing 5 ppm of ozone at a temperature of 10 to 20° C., oxide film having a thickness of 10 Å was formed. After that, the main surface of each wafer was subjected to mirror polishing by the chemical polishing using colloidal silica, and a removal amount in the polishing was 0.2 μm. Thus, epitaxial wafers were produced.

As a Comparative Example, epitaxial wafers were produced in accordance with the similar procedure save not performing the wafer flattening pretreatment step.

Figure 6:
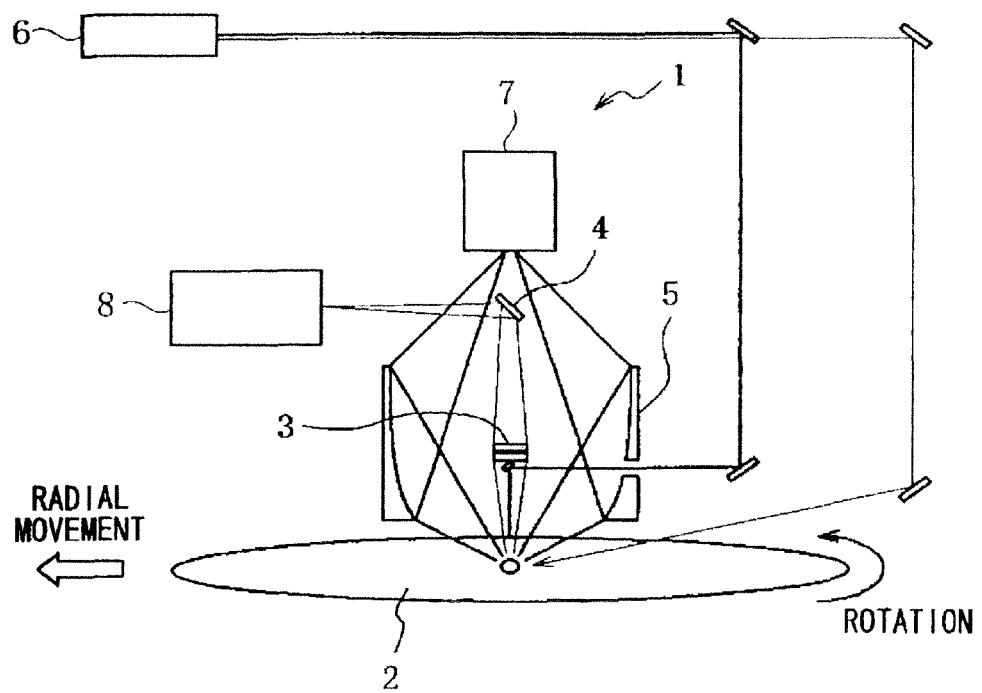
FIG. 6 is a diagram for explaining principle of LPD inspection apparatus which was used in the Example for measuring LPDs on the main surface of the wafer.

LPDs existing on each of test sample wafers (Example and Comparative Example) were measured using the LPD measuring device 1, as illustrated in FIG. 6, utilizing laser light for the measurement. In the measurement, laser light having a wave length of 300 to 400 nm was generated from the light source 6 and was reflected and radiated onto the wafer. The radiated portion of the wafer was moved by moving the wafer in the radial direction while rotating the wafer. Reflected light of a wide angle was introduced to the wide angle light detector 7 using a mirror condenser, reflected light of a narrow angle was introduced to the narrow angle light detector using lens condensers 3, 4, and size and number of LPDs were measured. The results of measurement are shown in FIG. 7A and FIG. 7B.

As it is shown in the results in FIG. 7A and FIG. 7B, detected LPD size was not larger than 65 nm in the present invention (Example). While, in the conventional example (Comparative Example) in which wafer flattening pretreatment was not performed, detected size of LPD was not smaller than 80 nm.

In the measurement using the LPD measuring device 1 utilizing laser light in the measurement, LPDs of smaller than 80 nm could not be detected on the conventional example because of large noise in the measurement. On the other hand, in the Example, LPD size as small as 45 nm was measured and detected accurately. It can be understood that the (110) wafer ({110} wafer) produced by the method according to the invention had a superior surface roughness.

In the method of producing an epitaxial wafer in the present invention, between an epitaxial growth step and surface polishing step, the wafer is further subjected to a wafer flattening pretreatment where a main surface of the wafer is treated in a treatment liquid of a predetermined composition at a temperature of 100° C., thereby forming an oxide film of a predetermined thickness while removing particles adhered to the main surface of the wafer. By this constitution, it was made possible to provide a production method of an epitaxial wafer having improved surface roughness, reduced detected size of LPDs and reduced numbers of adhered LPDs.

Where an epitaxial wafer is produced by the method of the present invention, even when the wafer is an epitaxial wafer made of a (110) crystal, the detected size of LPDs existing on the main surface of the wafer is 100 nm or less. Therefore, it is possible to measure and detect the size and number of LPDs sufficiently correctly using a wafer surface inspection device for measuring LPD on the main surface of the wafer utilizing a laser light.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of producing an epitaxial wafer, comprising the steps of:
   performing epitaxial growth of a silicon on a main surface of a wafer made of a silicon single crystal, thereby forming an epitaxial silicon layer;
   performing surface flattening pretreatment of the epitaxial silicon layer on the main surface of the wafer using a treatment liquid of a predetermined composition, thereby forming an oxide film of a predetermined thickness while removing particles adhered on the epitaxial silicon layer on the main surface of the wafer; and
   performing a surface polishing after the surface flattening pretreatment where the epitaxial silicon layer on the main surface of the wafer having the oxide film formed on the epitaxial silicon layer is mirror polished until a detected size of LPD existing on the surface of the epitaxial wafer is 100 nm or less;
   wherein the wafer made of a silicon single crystal is a double face polished {110} wafer;
   an amount of material removed in the surface polishing step is 0.1 to 1.0 μm;
   the predetermined thickness of the oxide film is in a range from 5 to 30 Å; and
   the treatment liquid is a solution containing 5 ppm to 40 ppm of ozone as an oxidizing agent in ultrapure water, the wafer being treated at a temperature of 10 to 30° C. for 10 seconds to 20 minutes.

2. The method of producing an epitaxial wafer according to claim 1, further comprising mirror polishing a back surface of the wafer.

3. The method of producing an epitaxial wafer according to claim 1, further comprising, before the surface polishing step, edge polishing step to mirror polish a surface of edge portion of the wafer.

4. The method of producing an epitaxial wafer according to claim 3, wherein the surface flattening pretreatment is performed at least at one stage selected from a stage between the epitaxial growth and the edge polishing and a stage between the edge polishing step and the surface polishing step.

5. The method of producing an epitaxial wafer according to claim 1, wherein the mirror polishing step is performed by chemical polishing.

6. The method of producing an epitaxial wafer according to claim 1, wherein only the epitaxial silicon layer on the main surface of the wafer is mirror polished in the surface polishing step.

7. The method of producing an epitaxial wafer according to claim 1, further comprising:
- a step of removing a natural oxide film of the wafer by using a solution containing hydrofluoric acid after forming the epitaxial silicon layer on the main surface of the wafer and before the surface flattening pretreatment, and wherein
- the epitaxial silicon layer on both the main surface and a back surface of the wafer is mirror polished in the surface polishing step.

8. The method of producing an epitaxial wafer according to claim 1, wherein
- the wafer is immersed in the treatment liquid of the predetermined composition in the performing surface flattening pretreatment step.

9. The method of producing an epitaxial wafer according to claim 1, wherein the detected size of LPD existing on the surface of the epitaxial wafer is 58 nm or less after the surface polishing.

10. The method of producing an epitaxial wafer according to claim 1, the method further comprising: prior to the epitaxial growth,
- slicing the wafer from a silicon single crystal ingot;
- etching the main surface of the sliced wafer; and
- mirror polishing the main surface of the etched wafer.

* * * * *